United States Patent
Oliver et al.

(10) Patent No.: US 9,557,783 B2
(45) Date of Patent: Jan. 31, 2017

(54) CONFIGURABLE CARD SLOTS

(71) Applicant: Hewlett-Packard Development Company, L.P., Houston, TX (US)

(72) Inventors: Joseph Oliver, Magnolia, TX (US); James J. Shulze, Houston, TX (US); Keith A. Sauer, Spring, TX (US); Jeoff M. Krontz, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 23 days.

(21) Appl. No.: 14/606,414

(22) Filed: Jan. 27, 2015

(65) Prior Publication Data

US 2016/0216746 A1 Jul. 28, 2016

(51) Int. Cl.
*H05K 7/18* (2006.01)
*G06F 1/18* (2006.01)

(52) U.S. Cl.
CPC .............. *G06F 1/186* (2013.01); *G06F 1/184* (2013.01); *G06F 1/185* (2013.01); *G06F 1/187* (2013.01); *G06F 1/188* (2013.01)

(58) Field of Classification Search
USPC .......................... 361/727–730, 807, 809, 810
See application file for complete search history.

(56) References Cited

U.S. PATENT DOCUMENTS

| | | | | |
|---|---|---|---|---|
| 5,574,625 | A * | 11/1996 | Ohgami | G06F 1/1626 312/223.2 |
| 6,287,143 | B1 * | 9/2001 | Lwee | G11B 33/126 439/159 |
| 6,540,523 | B1 * | 4/2003 | Kung | H01R 12/721 439/541.5 |
| 6,594,150 | B2 | 7/2003 | Creason et al. | |
| 7,075,797 | B1 | 7/2006 | Leonard et al. | |
| 7,094,107 | B2 * | 8/2006 | Wu | H01R 27/00 439/188 |
| 7,381,096 | B2 * | 6/2008 | Alejandro | H01R 29/00 439/638 |
| 7,889,508 | B2 * | 2/2011 | Sato | H05K 7/1461 361/741 |
| 8,717,749 | B2 | 5/2014 | Bottom et al. | |
| 2005/0213294 | A1 | 9/2005 | Lambert et al. | |
| 2008/0192431 | A1 | 8/2008 | Bechtolsheim | |
| 2008/0259555 | A1 | 10/2008 | Bechtolsheim et al. | |
| 2012/0232849 | A1 | 9/2012 | Kosugi | |

* cited by examiner

*Primary Examiner* — Hung S Bui
(74) *Attorney, Agent, or Firm* — Brooks, Cameron & Huebsch, PLLC

(57) ABSTRACT

An example computer chassis can include a first card slot, a second card slot, and a rear wall. The first card slot can be configurable to a full height position. The second card slot can be configurable to one of a full height position and a low profile position.

13 Claims, 3 Drawing Sheets

CONFIGURABLE CARD SLOTS

BACKGROUND

Computing systems can consist of three main parts, a central processing unit (CPU) to process data, a memory to hold the data, and a variety of peripherals (e.g., devices to input and output information to and from a computer). CPUs and memory can be tightly coupled and share signaling characteristics that operate synchronously. A bus can connect the CPU and memory. The bus can be a number of sizes and can include a number of configurations.

DETAILED DESCRIPTION

A computing system can be contained in a computer chassis. A computer chassis is an enclosure that can include a number of components (e.g., motherboard, form factors, power supply unit, drive bays, etc.) of a computing device (e.g., a desktop computer, a laptop computer, a server). A computer chassis can be an enclosure for a server blade of a server. A server blade can include a thin, modular electronic circuit board containing one or more microprocessors and memory.

A computer chassis can include slots to receive a number of computer buses. A computer bus connects the CPU and the memory and can be manufactured in a number of configurations and sizes. A computer bus can be associated with a number of bus standards. For example, computer bus standards can include conventional peripheral component interconnect (referred to generally as PCI), peripheral component interconnect eXtended (referred to as PCI-X), accelerated graphics port (referred to as AGP), and peripheral component express (referred to as PCIe), among other standards. PCIe is a high-speed serial computer expansion bus standard designed to replace the PCI, PCI-X, and AGP standards.

A number of types of computer bus cards can be inserted into a computer chassis. A number of computer card types can include a low profile card (e.g., half-height bus card) and a full height card (e.g., standard bus card). A low profile PCIe card can be referred to as an MD2 low profile form factor. A low profile card can use a reduced bracket size and have difficulty fitting into a standard bus card slot. By comparison, a full height card can use a higher bracket height. By removing and inserting different types of bus cards, a system can be upgraded and/or downgraded based on changing computing requirements and/or requested capabilities. In order to accommodate multiple types without changing the computer chassis, a configurable bus slot riser system can allow for switching from one bus card type to another.

Figure 1:
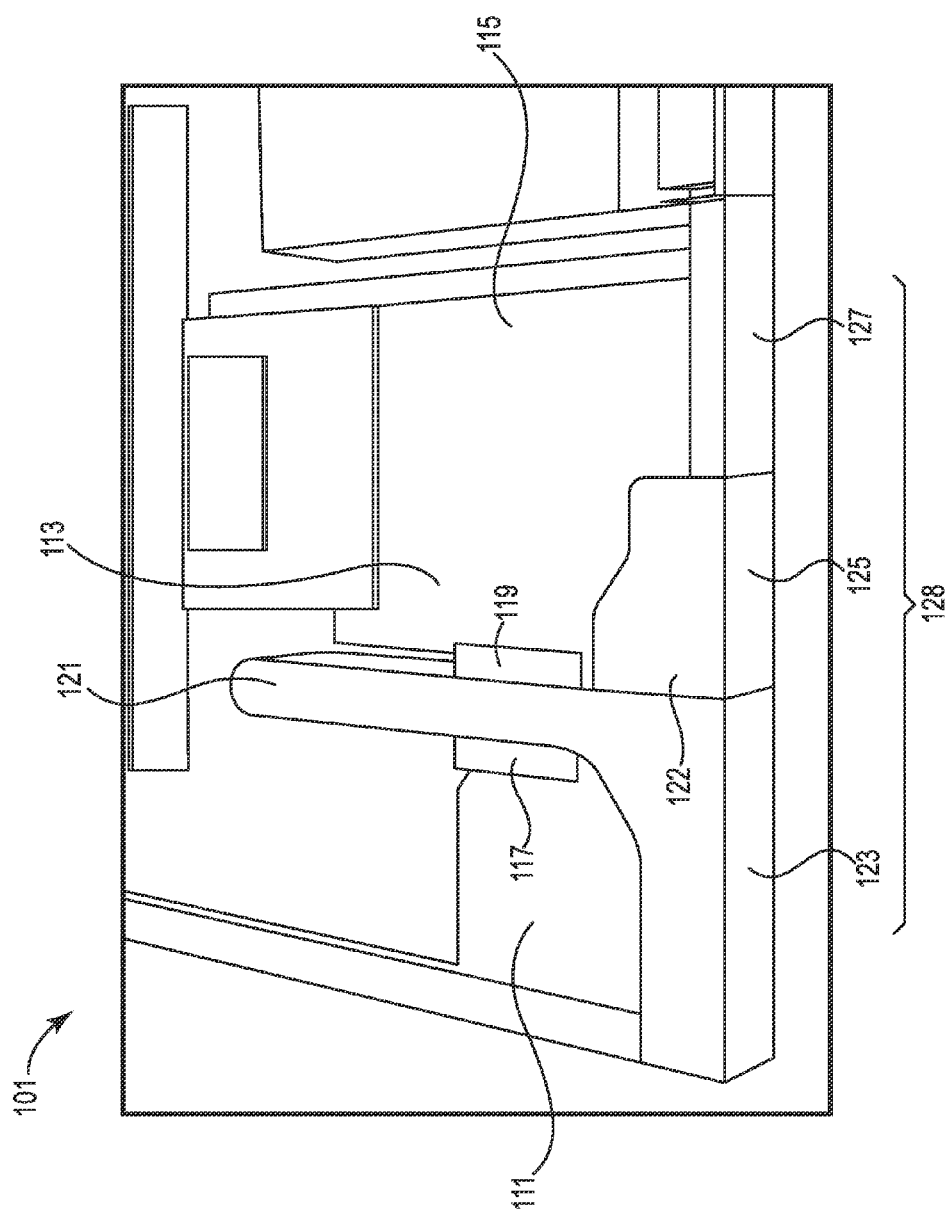
FIG. 1 illustrates an example of a computer chassis according to the present disclosure.

FIG. 1 illustrates a diagram of an example of a computer chassis according to the present disclosure. The illustrated computer chassis (e.g., computer chassis 101) is a portion of a computer chassis excerpted from a total computer chassis. The size, length, and/or width of the computer chassis is not limited to the illustrated example. That is, the computer chassis can include additional space, components, slots, etc. not illustrated in FIG. 1. The computer chassis 101, as used herein, includes a number of card slots (e.g., bus card slots, PCIe card slots) 111, 113, 115. The number of card slots 111, 113, 115 can be on top of a number of computer components. For example, the computer chassis, below the card slots, can include circuits, processors, cooling units, etc. (not pictured but mentioned as an example).

The number of card slots 111, 113, 115 can each receive a card (e.g., a bus card, a PCIe card). A first card slot 111 can include a connector 117 to connect a card (e.g., a PCIe card) to the computer of the computer chassis 101. A second card slot 113 can include a connector 119 to connect a card (e.g., a PCIe card) to the computer. A third card slot 115 can be empty in the illustrated configuration of FIG. 1 since there is not a riser associated with the third card slot 115 (further illustrated in FIGS. 2 and 3). A riser can include a portion of a computer chassis that includes portion to receive and/or hold in place a card (e.g., a bus card, a PCIe card) and to include a connector for the card to plug into.

A primary riser 121 can be associated with the first card slot 111 and the second card slot 113. The primary riser 121 can include a low profile portion 122 of the primary riser 121. The primary riser 121 can be used to hold and/or connect (through connector 117) a card in the first card slot 111 and/or the second card slot 113. For example, a card (e.g., a bus card, a PCIe card) can be inserted into the first card slot 111 and connected to the connector 117 of the primary riser 121 to be plugged into the computer chassis 101. A low profile bracket 125 can be associated with the second card slot 113 and can be used along with the low profile portion 122 of the primary riser 121 to hold a low profile card (e.g., a low profile PCIe card). When the second card slot 113 includes the low profile bracket 125 and the primary riser 121 includes the low profile portion 122, the second card slot 113 is in a low profile position. A low profile position refers to a card slot that is configured to receive a low profile card.

A rear wall (e.g., a rear I/O wall) 128 of the chassis 101 can include a number of brackets 123, 125, and 127. A first bracket 123 can be associated with the first card slot 111 which is associated with connector 117, a second bracket 125 can be associated with a second card slot 113 which is associated with connector 119, and a third bracket 127 can be associated with a third card slot 115. As illustrated in FIG. 1, the second bracket 125 can be configured for a low profile card to be inserted into the chassis 101 at the second card slot 113. The second bracket 125 and third bracket 127 can be removable to accommodate a number of full height and low profile positions for cards. In this example in FIG. 1, the third card slot 115 includes a blank for the third bracket 127 and is illustrated as empty (e.g., does not include a riser to receive a low profile card or a full height card) but examples are not so limited (as demonstrated in FIGS. 2 and 3).

As illustrated in FIG. 1, a first card can be inserted into the first card slot 111 in a full height position by connecting to connector 117 attached to primary riser 121. A second card can be inserted into the second card slot 113 in a low profile position using the low profile bracket 122 and by connecting to connector 119 attached to primary riser 121. The third card slot 115 can be empty.

Figure 2:
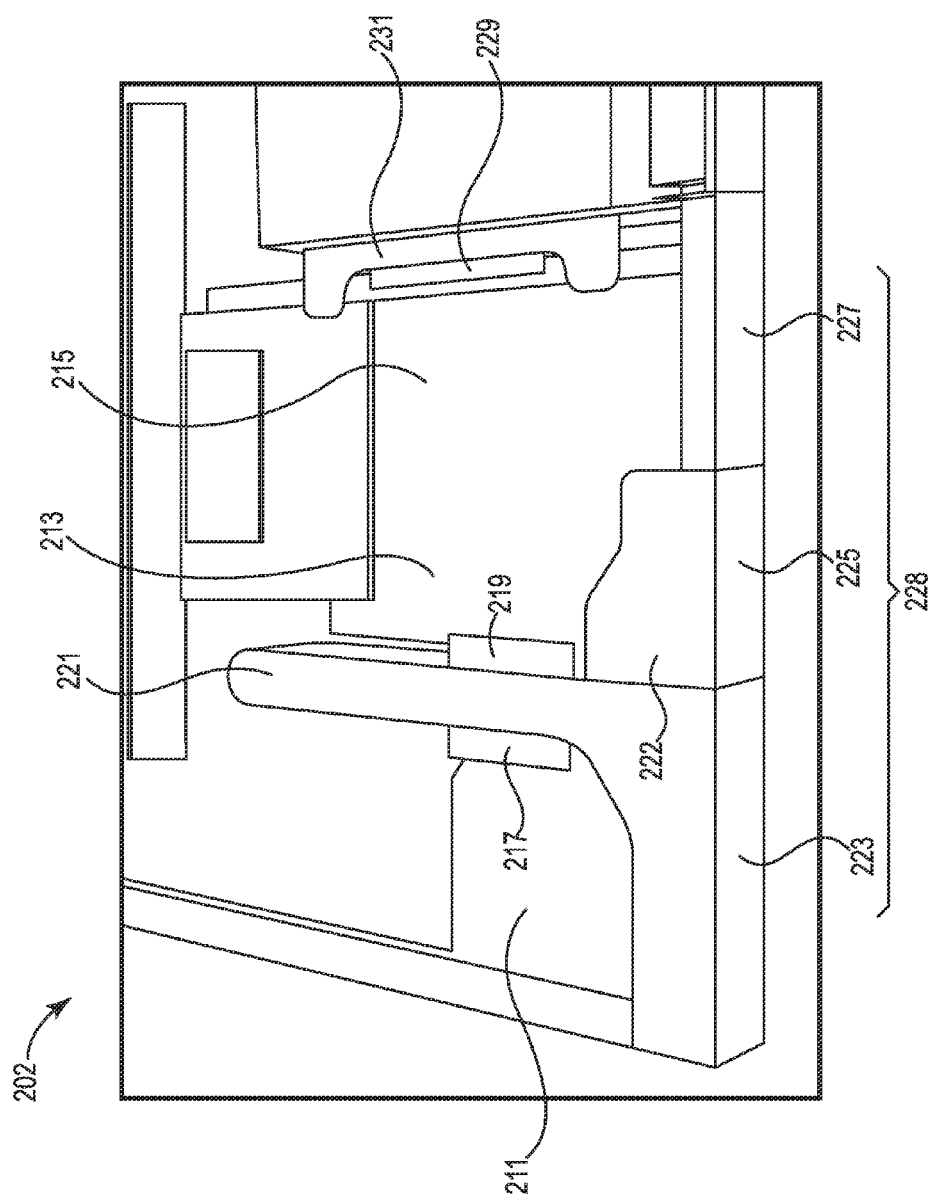
FIG. 2 illustrates an example of a computer chassis according to the present disclosure.
Figure 3:
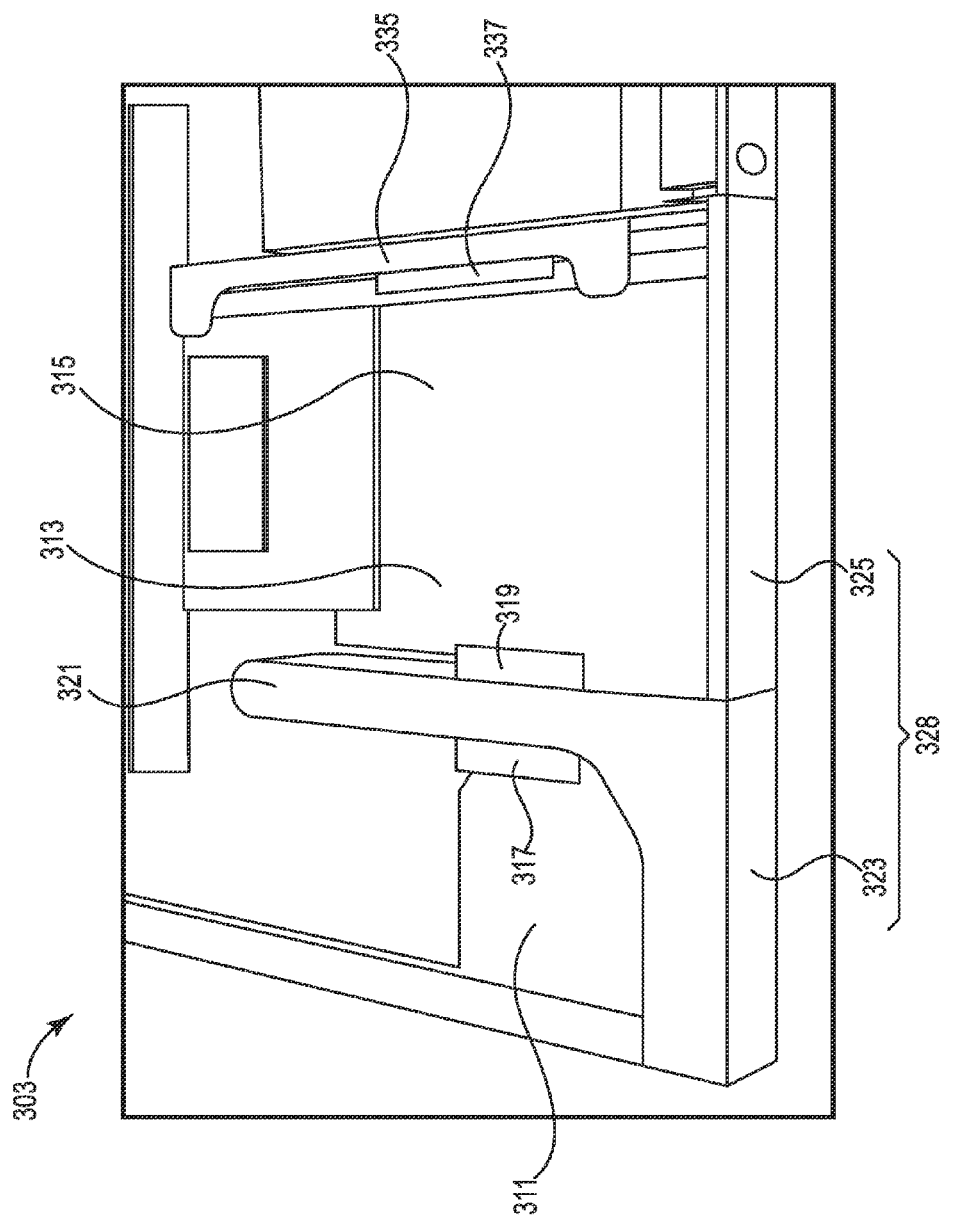
FIG. 3 illustrates an example of a computer chassis according to the present disclosure.

As described, FIG. 1 illustrates a computer chassis configured to receive a full height card (e.g., in the first card slot 111) and a low profile card (e.g., in the second card slot 113). FIG. 1 shows the third card slot 115 empty. The removeable brackets (e.g., brackets 125 and 127) of the rear wall 128 allow the computer chassis to also receive a different number of full height and low profile cards (as illustrated in FIGS. 2 and 3, for example) depending on the configuration of the brackets and risers. In this way, the computer chassis 101 is configurable in a number of arrangements without switching to a different computer chassis altogether.

FIG. 2 illustrates an example of a computer chassis 202 according to the present disclosure. FIG. 2 illustrates a different configuration of the system described in FIG. 1. That is, FIG. 1 illustrates no low profile riser associated with the third card slot while a low profile riser (e.g., riser 231) and third connector (e.g., connector 229) can be added to the illustration in FIG. 1 (associated with the third card slot) to convert to the example illustrated in FIG. 2. The computer chassis 202, as used herein, includes a number of card slots (e.g., bus card slots, PCIe card slots) 211, 213, 215. The number of card slots 211, 213, 215 can each receive a card (e.g., a bus card, a PCIe card). A first card slot 211 can include a connector 217 to connect a first card (e.g., a PCIe card) to the computer of the computer chassis 202. A second card slot 213 can include a connector 219 to connect a second card (e.g., a PCIe card) to the computer. A third card slot 215 can include a connector 229 to connect a third card (e.g., a PCIe card) to the computer of the computer chassis 202.

A primary riser 221 can be associated with the first card slot (e.g., bus card slot, PCIe card slot) 211 and the second card slot (e.g., bus card slot, PCIe card slot) 213. The primary riser can be used to hold and/or connect (through connector 217) a card in the first card slot 211 and/or the second card slot 213 (connected through connector 219). For example, a card can be inserted into the first card slot 211 and connected to connector 217 of the primary riser 221 to be plugged into the computer chassis 202. A low profile portion 222 of the primary riser 221 can be associated with the second card slot 213 and can be used to hold a low profile card (e.g., a PCIe card). When the second card slot 213 includes the low profile bracket 225 and the primary riser 221 includes the low profile portion 222, the second card slot 113 is in a low profile position.

A rear wall 228 of the chassis 202 can include a number of brackets 223, 225, and 227. A first bracket 223 can be associated with the first card slot 211, a second bracket 225 can be associated with a second card slot 213, and a third bracket 227 can be associated with a third card slot 215. As illustrated in FIG. 2, the second bracket 225 can be configured for a low profile card to be inserted into the chassis 202 at the second card slot 213. The second bracket 225, third bracket 227, and low profile portion 222 can be removable to accommodate a number of full height and low profile positions for cards. In this example in FIG. 2, the first card slot 211 is configured to receive a full height card, the second card slot 213 is configured to receive a low profile card, and the third card slot 215 is configured to receive a low profile card. That is, a first card can be inserted into the first card slot 211 in a full height position by connecting to connector 217 attached to primary riser 221. A second card can be inserted into the second card slot 213 in a low profile position using the low profile bracket 225 and low profile portion 222 and by connecting to connector 219 attached to primary riser 221. A third card can be inserted into the third card slot 215 in a low profile position using the low profile bracket 227 and by connecting to connector 229 attached to low profile riser 231. The low profile riser 231 can be inserted to accommodate a low profile card in the third card slot 215 (e.g., FIG. 1 illustrates no low profile riser associated with the third card slot and the low profile riser can be added to the illustration in FIG. 1 to convert to the example illustrated in FIG. 2).

The second bracket 225, third bracket 227, and low profile portion 222 are removable to change a second card slot 213 and third card slot 215 from a configuration to receive low profile cards to a configuration to receive a full height card. That is, the low profile portion 222 and second bracket 225 is removed to convert the low profile position of the second card slot 213 into a configuration to receive a full height card. In addition, the low profile riser 231 is removed and replaced with a full height riser (e.g., full height riser 335 illustrated in FIG. 3 and described below).

As described, FIG. 2 illustrates a computer chassis 202 that receives a full height card (e.g., in the first card slot 211) and two low profile cards (e.g., in the second card slot 213 and the third card slot 215). FIG. 2 illustrates a low profile riser 231 and connector 229 to allow a second low profile card (e.g., in the third card slot 215) to be inserted into the computer chassis 202. The configurability of the brackets 225 and 227 (and low profile portion of primary riser 221) allow for a different number of full height and low profile cards (as illustrated in FIGS. 1 and 3).

FIG. 3 illustrates an example of a computer chassis according to the present disclosure. The apparatus of FIG. 3 includes a computer chassis 303. The computer chassis 303, as used herein, includes a number of card slots (e.g., bus card slots, PCIe card slots) 311, 313, 315. The number of card slots 311, 313, 315 can each receive a card (e.g., a bus card, a PCIe card). A first card slot 311 can include a connector 317 to connect a first card (e.g., a PCIe card) to the computer of the computer chassis 303. A second card slot 313 can include a connector 319 (which is not used in this illustrated example). A third card slot 315 can include a connector 337 to connect a third card (e.g., a PCIe card) to the computer of the computer chassis 302.

A primary riser 321 can be associated with the first card slot (e.g., bus card slot, PCIe card slot) 311. The primary riser can be used to hold and/or connect (through connector 317) a card in the first card slot 311 (Note that in FIG. 3 the lower portion, illustrated as 122 and 222 in FIGS. 1 and 2, respectively, has been removed). For example, a card can be inserted into the first card slot 311 and connected to connector 317 of the primary riser 321 to be plugged into the computer chassis 303. The second card slot 313 can be used to hold a full height card that uses connection associated with the third card slot 315 (e.g., connector 337 and full height riser 335).

A rear wall 328 of the chassis 303 can include a number of brackets 323 and 325. A first bracket 323 can be associated with the first card slot 311 and a second bracket 325 can be associated with a second card slot 313 and a third card slot 315. As illustrated in FIG. 3, the second bracket 325 can be configured for a full height card to be inserted into the chassis 303 at the second card slot 313 and third card slot 315. The second bracket 325 can be removable to accommodate a number of full height and low profile positions for cards (e.g., as illustrated in FIGS. 1 and 2 and described above). In this example in FIG. 3, the first card slot 311 is configured to receive a full height card and the second and third card slots 313, 315 are configured to receive a full height card. That is, a first card (e.g., a full height card, a full height bus card, a full height PCIe card) can be inserted into the first card slot 311 in a full height position by connecting to connector 317 attached to primary riser 321. A second card (e.g., a full height card, a full height bus card, a full height PCIe card) can be inserted into the second and third card slots 313, 315 in a full height position using the full height bracket 325 and by connecting to connector 337 attached to full height riser 335.

The second bracket 325 is removable to change the second and third card slots 313, 315 from a configuration to receive one full height card to a configuration to receive a number of low profile cards (e.g., one low profile card, two low profile cards). That is, the full height bracket 325 can be removed and at least one low profile bracket (e.g., second bracket 125, 225 and third bracket 127, 227) can be inserted to replace the full height bracket 325. A lower portion (e.g., lower portion 122, 222) can be attached to the primary riser 321 to hold a low profile riser in the second card slot 313 (as illustrated in FIGS. 1 and 2).

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A computer chassis, comprising:
    a first card slot configurable to a full height position;
    a second card slot configurable to either the full height position or a low profile position, wherein the second card slot is configurable to receive one card;
    a third card slot configurable to a low profile position; and wherein the third card slot is configurable to the low profile position via a low profile riser when the second card slot is configured to the low profile position; and
    a rear wall configurable to include a low profile bracket or a full height bracket.

2. The computer chassis of claim 1, wherein the third card slot is configured to the low profile position when the second card slot is configured in the low profile position.

3. The computer chassis of claim 1, wherein the second card slot is configurable to the low profile position when a low profile portion of a riser associated with the first card slot and the second card slot is inserted.

4. The computer chassis of claim 1, wherein the second card slot receives a high profile riser to configure the second card slot in the full height position.

5. A computer chassis, comprising:
    a first card slot configurable to a full height position;
    a second card slot configurable to at least one of a low profile position and an empty position, wherein the second card slot is configurable to receive one card;
    a third card slot configurable to one of the full height position, the low profile position, and the empty position; and
    a rear wall configurable in:
        a first arrangement when the second card slot is configured to receive a low profile card and the third card slot is in the empty position;
        a second arrangement when the second card slot is configured to receive a low profile card and the third card slot is configured to receive a low profile card; and
        a third arrangement when the third card slot receives a card in the full height position.

6. The computer chassis of claim 5, wherein the second card slot is configured in the empty position when the third card slot is configured to the full height position.

7. The computer chassis of claim 5, wherein a full height riser is inserted into the third card slot and the rear wall is in the third arrangement and includes a full height bracket associated with the second card slot and the third card slot when the third card slot is configured to the full height position.

8. The computer chassis of claim 5, wherein a low profile riser is inserted into the third card slot and the rear wall is in the second arrangement and includes a low profile bracket associated with the third card slot when the third card slot is configured to the low profile position.

9. A computer chassis system, comprising:
    a first card slot configurable to a high profile position including a first full height riser;
    a second card slot configurable to receive a card in a low profile position or an empty position, wherein the second card slot is configurable to receive one card;
    a third card slot configurable to one of:
        a full height position using a removable full height riser;
        the low profile position using a removable low profile riser; and
        an empty position, wherein no riser is associated with the third card slot; and
    a rear wall configured to include a low profile bracket or a full height bracket.

10. The computer chassis system of claim 9, wherein a first card received by the first card slot, a second card received by the second card slot, and a third card received by the third card slot are PCIe computer bus cards.

11. The computer chassis system of claim 9, wherein:
    when the second card slot is configured to the low profile position, the third card slot is configurable to the low profile position by using the low profile brackets associated with the second card slot and the third card slot; and
    when the second card slot is empty, the third card slot is configurable to the full height position by using the full height bracket associated with the second card slot and the third card slot.

12. The computer chassis system of claim 9, wherein, when converting the third card slot from a low profile position to a full height position, a lower portion of a primary riser is removed and a low profile bracket associated with the second card slot and the third card slot is removed from the rear wall and a full height bracket associated with the second card slot and the third card slot is inserted.

13. The computer chassis system of claim 12, wherein the third card slot is configurable from a low profile position to a high profile position by:
   removing a low profile portion of a primary riser associated with the first card slot and the second card slot;
   removing the low profile riser of the third card slot; and
   inserting the full height riser in the third card slot.

\* \* \* \* \*